(12) United States Patent
Satou

(10) Patent No.: US 8,830,704 B2
(45) Date of Patent: Sep. 9, 2014

(54) POWER CONVERTER

(75) Inventor: Toshiaki Satou, Shiga (JP)

(73) Assignee: Daikin Industries, Ltd., Osaka-shi (JP)

( * ) Notice: Subject to any disclaimer, the term of this patent is extended or adjusted under 35 U.S.C. 154(b) by 266 days.

(21) Appl. No.: 13/515,706

(22) PCT Filed: Dec. 15, 2010

(86) PCT No.: PCT/JP2010/072549
§ 371 (c)(1),
(2), (4) Date: Jun. 13, 2012

(87) PCT Pub. No.: WO2011/089800
PCT Pub. Date: Jul. 28, 2011

(65) Prior Publication Data
US 2012/0250375 A1    Oct. 4, 2012

(30) Foreign Application Priority Data

Jan. 19, 2010   (JP) ................................ 2010-008739

(51) Int. Cl.
*H02M 7/219*  (2006.01)
*H02M 7/538*  (2007.01)
*H03K 17/567* (2006.01)

(52) U.S. Cl.
CPC ....... *H02M 7/538* (2013.01); *H03K 2217/0081* (2013.01); *H03K 17/567* (2013.01)
USPC ............................................ 363/37; 363/125

(58) Field of Classification Search
CPC ................ H02M 7/219; H02M 1/088; H02M 2007/219; H03K 2217/0081
USPC ................................. 363/125–127, 34–37, 44
See application file for complete search history.

(56) References Cited

U.S. PATENT DOCUMENTS

| | | | |
|---|---|---|---|
| 4,894,763 A * | 1/1990 | Ngo ................................ 363/35 |
| 5,031,087 A * | 7/1991 | Tuusa ............................. 363/63 |
| 6,522,098 B1 | 2/2003 | Majumdar et al. |
| 2005/0194925 A1 | 9/2005 | Ito et al. |
| 2008/0219036 A1 * | 9/2008 | Colombi et al. ............. 363/126 |
| 2009/0086515 A1 | 4/2009 | Sakakibara |
| 2010/0321965 A1 * | 12/2010 | Sakakibara ..................... 363/37 |
| 2011/0236591 A1 * | 9/2011 | Madocks et al. ............. 427/523 |

FOREIGN PATENT DOCUMENTS

| | | | |
|---|---|---|---|
| JP | 7-250485 A | 9/1995 |
| JP | 2004-153889 A | 5/2004 |
| JP | 2007-295686 A | 11/2007 |
| JP | 4158715 B2 | 10/2008 |

* cited by examiner

*Primary Examiner* — Harry Behm
(74) *Attorney, Agent, or Firm* — Birch, Stewart, Kolasch & Birch, LLP

(57) ABSTRACT

A power supply unit has one end on the low potential side, said end being connected to a switching element on the power supply line side, and serves as an operation power supply for outputting a switch signal to the switching element. A switching element includes a first and a second electrode, and renders an electric current in only a direction from the second electrode to the first electrode conducting. A diode is connected in parallel to the switching element while the cathode thereof is directed to a power supply line. A capacitor has one end connected to the first electrode of the switching element and the other end connected to the other end of the power supply unit, and serves as an operation power supply for outputting a switch signal to the switching element.

12 Claims, 6 Drawing Sheets

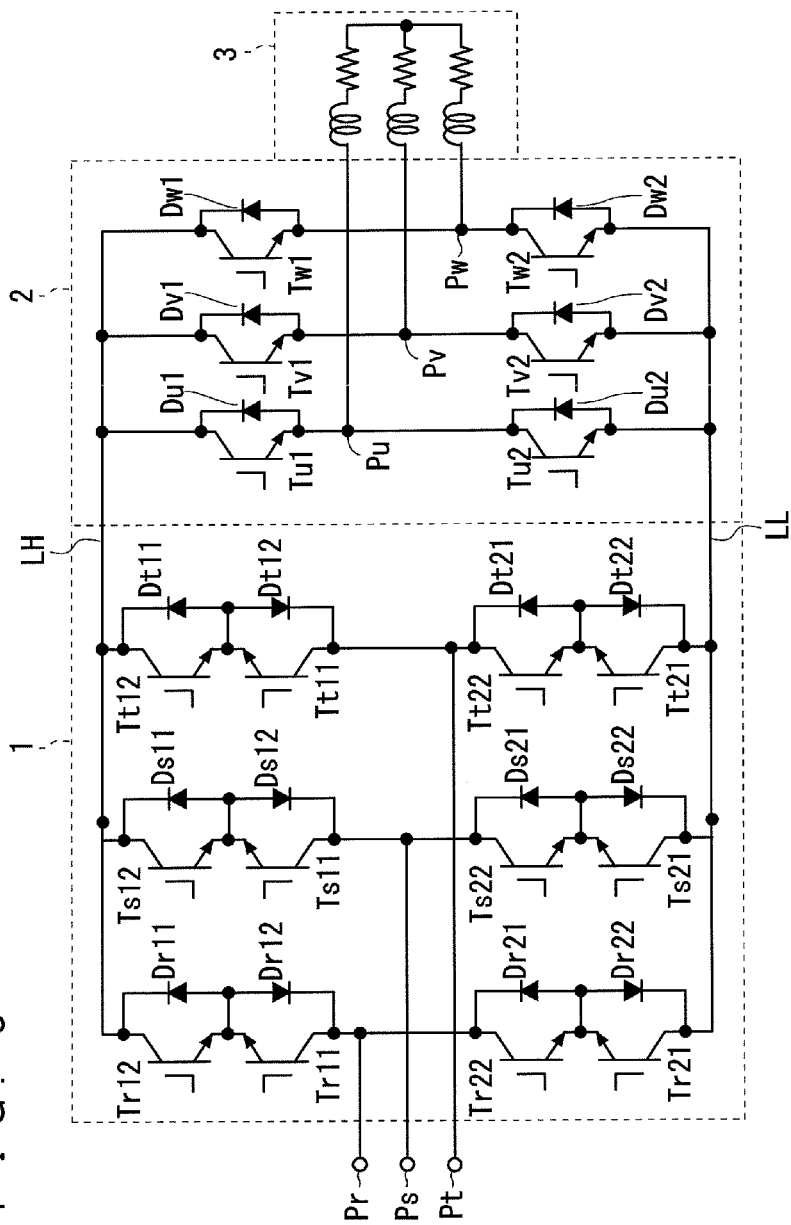
F I G . 5

POWER CONVERTER

TECHNICAL FIELD

The present invention relates to power converters, and in particular, to an operation power supply for outputting the switch signal to a switching element.

BACKGROUND ART

Japanese Patent Application Laid-Open No. 7-250485 describes an inverter. The inverter includes an upper side switching element and a lower side switching element connected in series to each other between two direct current (DC) power supply lines. A first internal control circuit for providing a switch signal is connected to the upper side switching element, and a second internal control circuit for providing a switch signal is connected to the lower side switching element.

The DC power supply is supplied to the second internal control circuit as the operation power supply. A voltage between both ends of a capacitor is supplied to the first internal control circuit as the operation power supply. A diode is connected between one end on a high potential side of the capacitor and one end on a high potential side of the DC power supply. The diode is arranged with an anode directed towards the DC power supply.

According to such configuration, the capacitor is charged with the DC power supply as a power supply by conduction of the lower side switching element.

Techniques related to the present invention are also disclosed in Japanese Patent Publication No. 4158715 and Japanese Patent Application Laid-Open No. 2007-295686.

SUMMARY OF THE INVENTION

Problems to be Solved by the Invention

In Japanese Patent Application Laid-Open No. 7-250485, however, the operation power supply of the switching element other than the switching element of the inverter is not considered.

The voltage type inverter as described in Japanese Patent Application Laid-Open No. 7-250485 is arranged with an emitter electrode directed towards a DC power supply line on the low potential side. Thus, the emitter electrode of the lower side switching element is connected to the DC power supply line on the low potential side. As such DC power supply line functions as a common potential of the lower side switching element, the common DC power source can be adopted for the operation power supply of a plurality of lower side switching elements.

The electric current type converter, on the other hand, includes upper side and lower side switching elements. An attempt is thus made to connect the DC power source of the operation power supply of the lower side switching element of the inverter to the lower side switching element of the electric current type converter on the basis of the technical idea of the prior art.

However, the switching element adopted in the voltage type inverter is arranged with the emitter electrode directed towards the low potential side, whereas the switching element adopted in the electric current type converter is arranged with the emitter electrode directed towards the DC power supply line on the high potential side. Thus, the operation voltage cannot be appropriately supplied to the lower side switching element of the electric current type converter with such attempt.

It is an object of the present invention to provide a power converter capable of obtaining an operation voltage of a switching element of a power converter as a converter from an operation power supply of a switching element of a switch circuit.

Means for Solving the Problems

A first aspect of a power converter according to the present invention includes a first power supply line (LH); a second power supply line (LL) applied with a potential lower than that of the first power supply line; a switch circuit (2) including a switching element (Ty2, S4) arranged between the first and second power supply lines, and a power supply unit (Ed) having both ends between which a DC voltage is supported, one end on a low potential side of the ends being connected to the switching element on the second power supply line side, and serving as an operation power supply for outputting a switch signal to the switching element; and a power conversion unit (1) including a one-directional conduction switching element (Tx2, Tx21) including a first electrode and a second electrode, rendering only electric current flowing from the second electrode to the first electrode conducting, and being arranged between the first and second power supply lines with the first electrode directed towards the first power supply line side; a diode (Dx22) connected in parallel with the one-directional conduction switching element with an anode directed towards the first power supply line side; and a capacitor (Cbx2) including one end connected to the first electrode and another end electrically connected to another end of the power supply unit and serving as an operation power supply for outputting a switch signal to the one-directional conduction switching element when charged.

A second aspect of the power converter according to the present invention relates to the power converter according to the first aspect and further includes a second diode (Dbx2) arranged between the capacitor and another end of the power supply unit (Ed) with having an anode directed towards the power supply unit.

A third aspect of the power converter according to the present invention relates to the power converter according to the first or second aspect and further includes a third diode (Dx21) having a cathode directed towards the first power supply line, and an anode connected with the first electrode of the one-directional conduction switching element.

A fourth aspect of the power converter according to the present invention relates to the power converter according to the third aspect, where the power conversion unit (1) further includes a second switching element (Tx22) connected in series with the one-directional conduction switching element (Tx21) and connected in parallel with the third diode, and the capacitor functions as an operation power supply for outputting switch signal to the second switching element.

A fifth aspect of the power converter according to the present invention relates to the power converter according to any one of first to fourth aspects, where the switch circuit (2) further includes a voltage adjustment unit (VAy2) for dropping a voltage of the power supply unit (Ed) and supplying an operation voltage of the switching element (Ty2).

Effect of the Invention

According to the first aspect of the power converter of the present invention, the electric current flows from the power supply unit to the capacitor via the diode. Thus, the capacitor can be charged using the operation power supply with respect to the switching element of the switch circuit. In other words, the operation voltage of the one-directional conduction switching element can be obtained from the operation power supply of the switching element of the switch circuit.

According to the second aspect of the power converter of the present invention, the potential of the first electrode of the one-directional conduction switching element becomes higher than the potential of the second power supply line in the normal operation, so that even if the voltage between the second power supply line and the other end of the capacitor (one end on high potential side) becomes higher than the voltage of the power supply unit, the difference between such voltage and the voltage at one end on the high potential side of the power supply unit can be supported by the second diode. Therefore, such voltage is prevented from being applied to the power supply unit, and furthermore, to the switching element.

According to the third aspect of the power converter of the present invention, the low voltage withstanding element can be adopted for the one-directional conduction switching element, the diode, and the second diode.

According to the fourth aspect of the power converter of the present invention, the one-directional conduction switching element, the second switching element, and the first and third diodes may configure a bi-directional switch. Furthermore, the manufacturing cost can be reduced since the capacitor functions as the operation power supply of not only the one-directional conduction switching element but also of the second switching element, compared to when the capacitor is arranged in each.

According to the fifth aspect of the power converter of the present invention, the difference in the voltage of the power supply unit and the voltage between both ends of the capacitor can be reduced.

The objects, characteristics, aspects and advantages of the present invention will become apparent by reference to the following description and the accompanying drawings.

BRIEF DESCRIPTION OF THE DRAWINGS

FIGS. 1 to 6 are views each showing one example of a conceptual configuration of a power converter.

EMBODIMENT FOR CARRYING OUT THE INVENTION

First Embodiment

<One Example of Power Converter>

Figure 1:
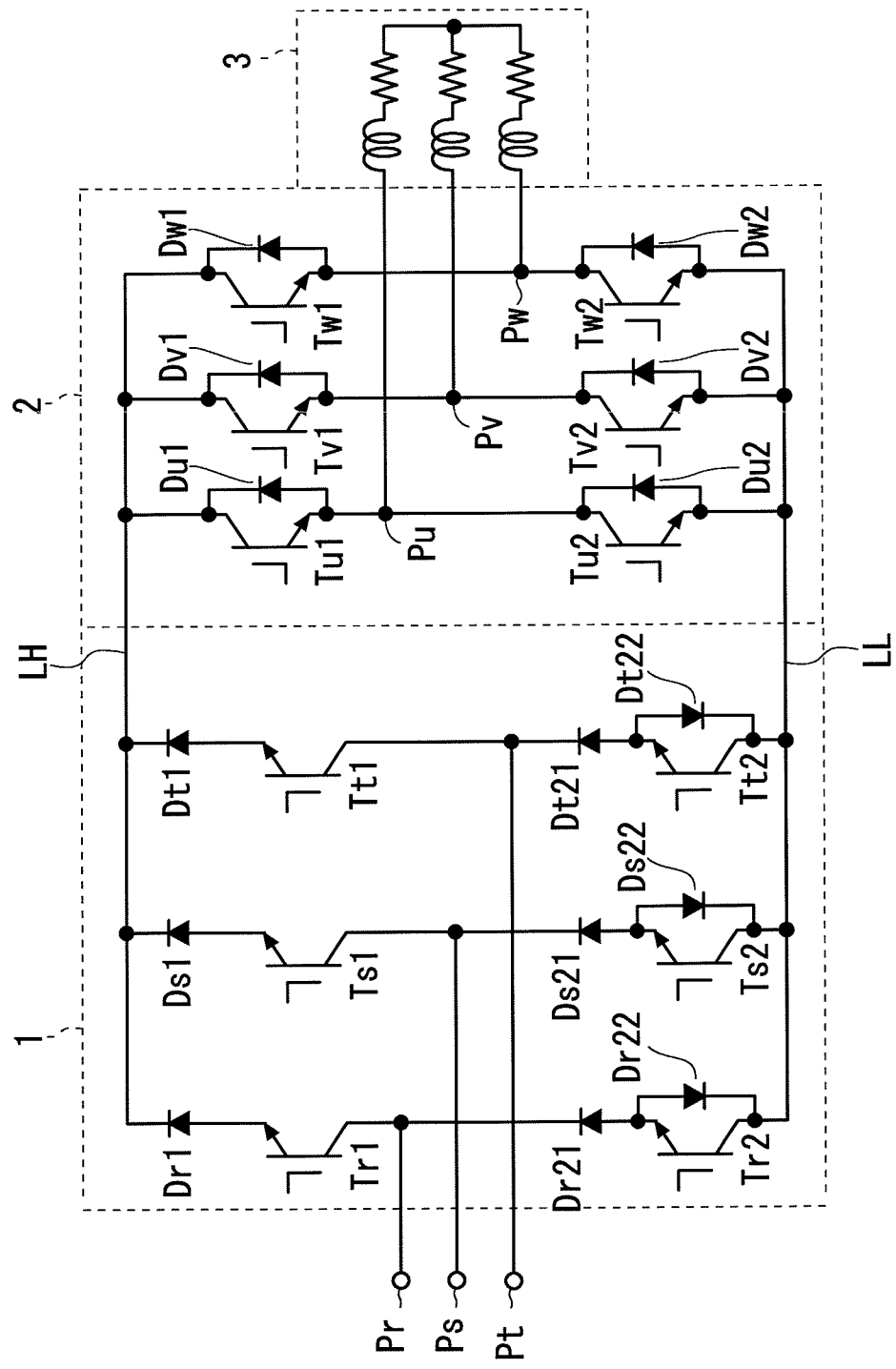

A power converter shown in FIG. 1 includes a converter 1, which is a power conversion unit serving as its configuring element, and an inverter 2, which is a switch circuit serving as its configuring element.

Input ends Pr, Ps, Pt are connected to the converter 1. For instance, a three-phase alternating current (AC) power source is connected to the input ends Pr, Ps, Pt and supplies a three phase AC voltage to the input ends Pr, Ps, Pt. The converter 1 converts a three-phase AC voltage applied to the input ends Pr, Ps, Pt to a DC voltage, and applies the same to DC power supply lines LH, LL. Describing a more specific configuration, the converter 1 has a switching leg for three phases, the r, s, and t phases. The switching leg of the r phase includes switching elements Tr1, Tr2, and diodes Dr1, Dr21, Dr22. The switching leg of the s phase includes switching elements Ts1, Ts2, and diodes Ds1, Ds21, Ds22. The switching leg of the t phase includes switching elements Tt1, Tt2, and diodes Dt1, Dt21, Dt22. The three switching legs are connected in parallel to each other between the DC power supply lines LH, LL.

The switching element Tx1 (x represents r, s, t) includes first to third electrodes. The switching element Tx1 conducts/non-conducts the electric current flowing between the first electrode and the second electrode. A switch signal (voltage signal and current signal) for controlling conduction/non-conduction of the switching element Tx1 is applied to the third electrode. The first electrode also functions as a control reference electrode, which becomes a reference of the switch signal (e.g., reference potential in the case of voltage signal). Examples of the switching element Tx1 include an insulated gate bipolar transistor, a field effect transistor, a bipolar transistor, and the like. In the case of the insulated gate bipolar transistor, the first to third electrodes respectively correspond to an emitter electrode, a collector electrode, and a gate electrode, for example. In the case of the field effect transistor, the first to third electrodes respectively correspond to a source electrode, a drain electrode, and a gate electrode, for example. In the case of the bipolar transistor, the first to third electrodes respectively correspond to an emitter electrode, a collector electrode, and a base electrode, for example. This aspect is also applied to the switching elements Ty1, Ty2, to be described later.

The switching element Tx2 (x represents r, s, t) includes first to third electrodes. The switching element Tx2 conducts/non-conducts the electric current flowing from the second electrode to the first electrode. In the switching element Tx2, the electric current from the second electrode towards the first electrode is not rendered conducting. Such switching element can be recognized as a one-directional conduction switching element. A switch signal (voltage signal and current signal) for controlling conduction/non-conduction of the switching element Tx2 is applied to the third electrode. The first electrode also functions as a control reference electrode, which becomes a reference of the switch signal (e.g., reference potential in the case of voltage signal). An example of such switching element Tx2 is an insulated gate bipolar transistor. In the insulated gate bipolar transistor, the first to third electrodes respectively correspond to an emitter electrode, a collector electrode, and a gate electrode, for example.

The description will be made below using the insulated gate bipolar transistor for the switching elements Tx1, Tx2.

The switching element Tx1 and the diode Dx1 are connected in series to each other between the DC power supply line LH and the input end Px. The switching element Tx1 is arranged with the emitter electrode directed towards the DC power supply line LH, and the diode Dx1 is arranged with the anode directed towards the input end Px. The switching element Tx2 and the diode Dx21 are connected in series with each other between the DC power supply line LL and the input end Px. The switching element Tx2 is arranged with the emitter electrode directed towards the input end Px (DC power supply line LH), and the diode Dx21 is arranged with the anode directed towards the DC power supply line LL. The diode Dx21 is arranged on the DC power supply line LH side with respect to the switching element Tx2. The diode Dx22 is connected in parallel with the switching element Tx2 with the anode directed towards the DC power supply line LH.

The switch signal is provided to the switching elements Tx1, Tx2, and the converter 1 converts the three-phase AC voltage to the DC voltage. A potential higher than a potential of the DC power supply line LL is thus applied to the DC power supply line LH. The diodes Dx1, Dx21 exhibit a reverse blocking ability of a converter. In other words, the converter 1 functions as a current source converter.

The inverter 2 converts the DC voltage between the DC power supply lines LH, LL to the AC voltage, and applies the same to a load 3 (e.g., motor). In the illustration of FIG. 1, the load 3 is drawn as an inductive load including a serial body of a resistor and a reactor.

The inverter 3 includes switching legs for the three phases, the u, v, w phases. The switching leg of the u phase includes switching elements Tu1, Tu2, and diodes Du1, Du2. The switching leg of the v phase includes switching elements Tv1, Tv2, and diodes Dv1, Dv2. The switching leg of the w phase includes switching elements Tw1, Tw2, and diodes Dw1, Dw2. The three switching legs are connected in parallel to each other between the DC power supply lines LH, LL.

The switching elements Ty1, Ty2 (y represents u, v, w) are, for example, an insulated gate bipolar transistor. The switching elements Ty1, Ty2 are connected in series to each other between the DC power supply lines LH, LL. The switching elements Ty1, Ty2 are both arranged with the emitter electrode directed towards the DC power supply line LL. The diodes Dy1, Dy2 are respectively connected in parallel to the switching elements Ty1, Ty2. The diodes Dy1, Dy2 are both arranged with the anode directed towards the DC power supply line LL.

The output end Py arranged between the switching elements Ty1, Ty2 is connected to the load 3.

The switch signal is provided to the switching elements Ty1, Ty2, and the inverter 3 converts the DC voltage to the AC voltage. The diodes Dy1, Dy2 respectively prevent the reverse current from flowing to the switching elements Ty1, Ty2, and also prevent the reverse voltage from being applied to the switching elements Ty1, Ty2.

<Operation Power Supply of Switching Element of Converter 1 and Inverter 2>

Figure 2:
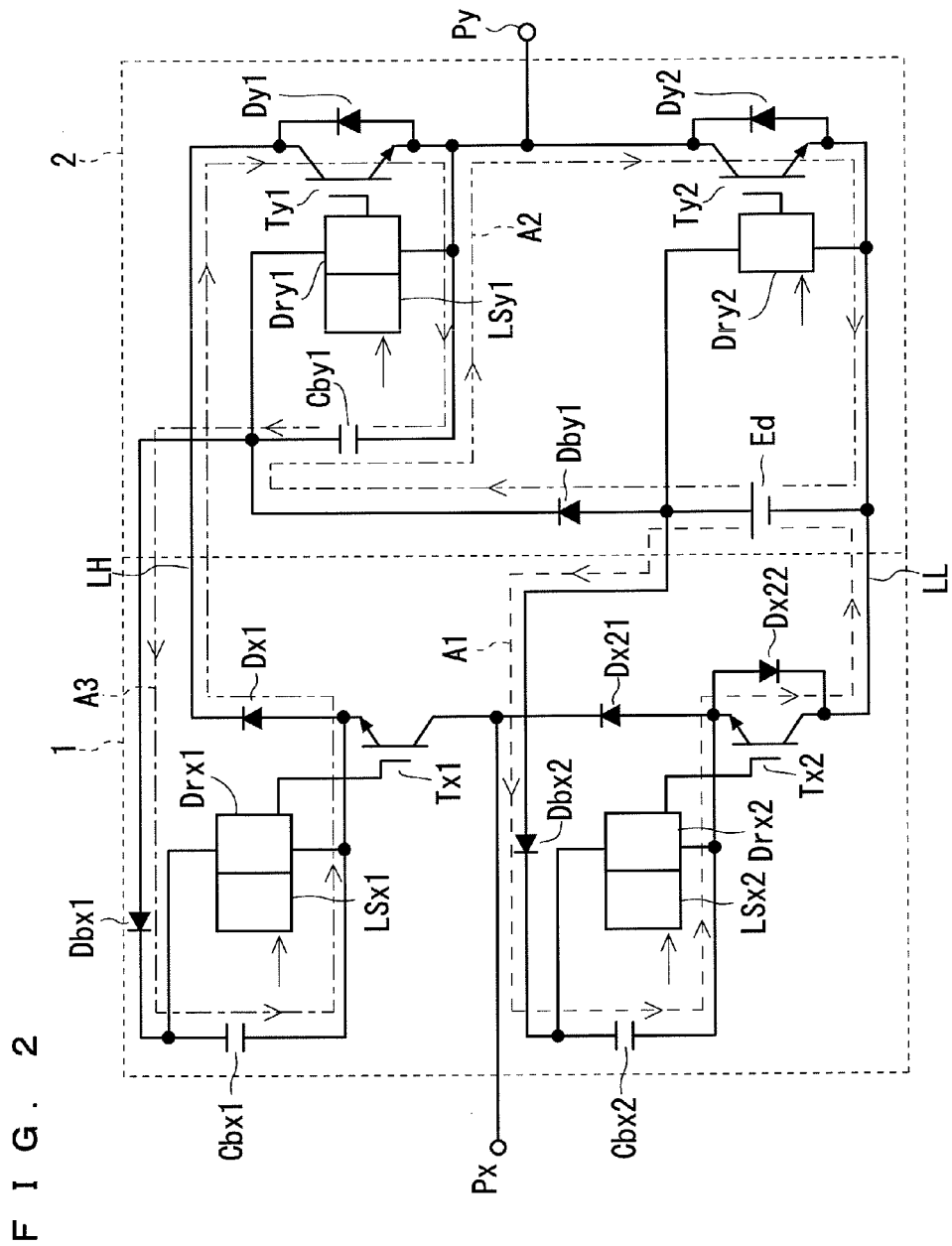

The operation power supply for outputting the switch signal to the switching elements Tx1, Tx2, Ty1, Ty2 will now be described with reference to FIG. 2. In the illustration of FIG. 2, only one switching leg of the converter 1 and only one switching leg of the inverter 3 are representatively illustrated.

The converter 1 includes drive circuits Drx1, Drx2 for driving the switching elements Tx1, Tx2, respectively, and the inverter 3 includes drive circuits Dry1, Dry2 for driving the switching elements Ty1, Ty2, respectively. The drive circuits Drx1, Drx2, Dry1, and Dry2 are respectively connected to gate electrodes of the switching elements Tx1, Tx2, Ty1, and Ty2.

In the illustration of FIG. 2, the operation power supply is supplied from the DC power supply Ed to the drive circuit Dry2. One end on a low potential side of the DC power supply Ed is connected to the emitter electrode of the switching element Ty2, and the drive circuit Dry2. One end on a high potential side of the DC power supply Ed is connected to the drive circuit Dry2.

The voltage between both ends of the capacitor Cbx2 is supplied to the drive circuit Drx2 as the operation power supply. One end of the capacitor Cbx2 is connected to the emitter electrode of the switching element Tx2 and the drive circuit Drx2. The other end of the capacitor Cbx2 is connected to the drive circuit Drx2. This content can be understood that the capacitor Cbx2 supports the DC voltage between the relevant one end and the relevant other end, and functions as the operation power supply for outputting the switch signal to the switching element Tx2. This content is also applied to other capacitors.

The level shift circuit LSx2 is connected to the drive circuit Drx2. The level shift circuit LSx2 appropriately shifts the potential level of the switch signal created by the common control circuit (not shown), for example, in accordance with the potential of the drive circuit Drx2, and provides the same to the drive circuit Drx2. This is similar in other level shift circuits, and thus the detailed description will be omitted below.

The other end of the capacitor Cbx2 is connected to one end on the high potential side of the DC power supply Ed through the diode Dbx2. The diode Dbx2 is arranged with the anode directed towards the DC power supply Ed. The diode Dbx2 prevents the capacitor Cbx2 from discharging to the DC power supply Ed.

The capacitor Cbx2 is charged prior to the normal operation of the power converter. Specifically, the electric current flows through the path from the DC power supply Ed to the capacitor Cbx2 through the diodes Dbx2, Dbx22. The capacitor Cbx2 is thus charged with the DC power supply Ed as the power source. In FIG. 2, the relevant path is shown as path A1.

Both diodes Dxb2, Dx22 are interposed on the path A1. The diode Dx22 may be simply arranged from the standpoint of preventing the capacitor Cbx2 from discharging towards the DC power supply Ed on the path A1. The diode Dbx2 is not an essential requirement in the most significant concept according to the present application. Further operations and effects of the diode Dbx2 will be described in a second embodiment.

In the power converter of FIG. 2, the capacitor Cbx2 can be charged by rendering the switching elements Tx1, Ty1, Ty2 conducting before performing the normal operation, even if the converter 1 does not include the diode Dx22. This is because the electric current flows through the path from the DC power supply Ed to the capacitor Cbx2 through the diodes Dbx2, Dx21, Dx1, and the switching elements Tx1, Ty1, Ty2 according to such conduction. In the illustration of FIG. 2, the switching elements Tx1, Ty1 receive the voltage between both ends of the boot capacitors Cbx1, Cby1 as the operation power supply. Therefore, the boot capacitors Cbx1, Cby1 need to be already charged in order to render the switching elements Tx1, Ty1 conducting. Such charging will be described later. The DC power source may be arranged in place of the boot capacitors Cbx1, Cby1, and such DC power source may function as the operation power supply of the switching element Tr1.

The following problems arise when the switching elements Tx1, Ty1, Ty2 is rendered conducting to charge the capacitor Cbx2. In other words, three diodes Dbx2, Dx21, Dx1 and three switching elements Tx1, Ty1, Ty2 are interposed on the path for charging the capacitor Cbx2. The voltage drop occurs in such diodes and switching elements, and hence only a voltage relatively small compared to the voltage of the DC power supply Ed can be charged in the capacitor Cbx2.

According to the present power converter, on the other hand, only two diodes Dbx2, Dx22 are interposed on the path A1, and hence the capacitor Cbx2 can be charged while suppressing the voltage drop. Therefore, a relatively large voltage can be charged to the capacitor Cbx2.

As will be described below, the electrostatic capacitance required by the capacitor Cbx2 can be reduced since the capacitor Cbx2 is also charged in the normal operation of the converter 1.

When the switching element Tx2 is rendered conducting in the normal operation, the electric current flows from the load 3 side to the input end Px through the switching element Ty2, the DC power line LL, and the switching Tx2. The forward voltage is applied to the switching element Tx2 by such electric current. In other words, the reverse voltage is applied to the diode Dx22. Therefore, the electric current does not flow through the path A1.

In this case, however, the electric current flows from the DC power supply Ed to the capacitor Cbx2 through the diode Dbx2 and the switching element Tx2. The electric current flowing through the switching element Tx2, that is, the sum of the electric current flowing from the load 3 and the electric current flowing from the DC power supply Ed through the capacitor Cbx2 flows in the forward direction from the collector electrode to the emitter electrode. As described above, the capacitor Cbx2 is charged since the electric current flows from the DC power supply Ed to the capacitor Cbx2 through the switching element Tx2.

At the transition period of when the switching element Tx2 switches from conduction to non-conduction, the electric current may flow to the capacitor Cbx2 through the path A1.

The capacitor Cbx2 is charged even in the normal operation, as described above. Therefore, the electrostatic capacitance required by the capacitor Cbx2 can be reduced.

If the diode Dx22 is not arranged, the boot capacitor Cbx2 is not charged when the switching element Tx2 is not conducted during the normal operation. Furthermore, the boot capacitor Cbx2 is not charged before the normal operation unless a special process for simultaneously rendering the switching elements Tx1, Ty1, Ty2 conducting is carried out, and thus the switching element Tx2 normally cannot be rendered conducting. In the present embodiment, on the other hand, charging can be performed even before the normal operation, and the charging can be performed during the normal operation through the diode Dx22, so that the opportunity the boot capacitor Cbx2 can be charged increases. Therefore, according to the present power converter, the electrostatic capacitance required by the boot capacitor Cbx2 can be reduced compared to a mode in which the diode Dx22 is not arranged.

One example of the operation power supply of the switching element Ty1 will now be described. The voltage between both ends of the boot capacitor Cby1 is supplied to the drive circuit Dry1 as the operation power supply. One end of the boot capacitor Cby1 is connected to the emitter electrode of the switching element Ty1 and the drive circuit Dry1. The other end of the boot capacitor Cby1 is connected to the drive circuit Dry1.

The level shift circuit LSy1 is connected to the drive circuit Dry1. The level shift circuit LSy1 receives the switch signal, appropriately level shifts such switch signal and outputs to the drive circuit Dry1.

The other end of the boot capacitor Cby1 is connected to one end on the high potential side of the DC power supply Ed through the diode Dby1. The diode Dby1 is arranged with the anode directed towards the DC power supply Ed. The diode Dby1 prevents the boot capacitor Cby1 from discharging to the DC power supply Ed.

According to such configuration, the boot capacitor Cby1 can be charged using the DC power supply Ed by rendering the switching element Ty2 conducting. This is because the electric current flows through the path A2 from the DC power supply Ed to the boot capacitor Cby1 through the diode Dby1 and the switching element Ty1.

One example of the operation power supply of the switching element Tx1 will now be described. A voltage between both ends of a boot capacitor Cbx1 is supplied to the drive circuit Drx1 as the operation power supply. One end of the boot capacitor Cbx1 is connected to the emitter electrode of the switching element Tx1 and the drive circuit Drx1. The other end of the boot capacitor Cbx1 is connected to the drive circuit Drx1.

The level shift circuit LSx1 is connected to the drive circuit Drx1. The level shift circuit LSx1 receives the switch signal, appropriately level shifts such switch signal and outputs to the drive circuit Drx1.

The other end of the boot capacitor Cbx1 is connected to one end on the high potential side of the boot capacitor Cby1 through the diode Dbx1. The diode Dbx1 is arranged with the anode directed towards the boot capacitor Cby1. The diode Dbx1 prevents the boot capacitor Cbx1 from discharging to the boot capacitor Cby1.

According to such configuration, the boot capacitor Cbx1 can be charged using the charges accumulated in the boot capacitor Cby1 by rendering the switching elements Tx1, Ty2 conducting. This is because the electric current flows through a path A3 from the boot capacitor Cby1 to the boot capacitor Cbx1 through the diodes Dbx1, Dx11 and the switching elements Tx1, Ty1.

Variant

Figure 3:
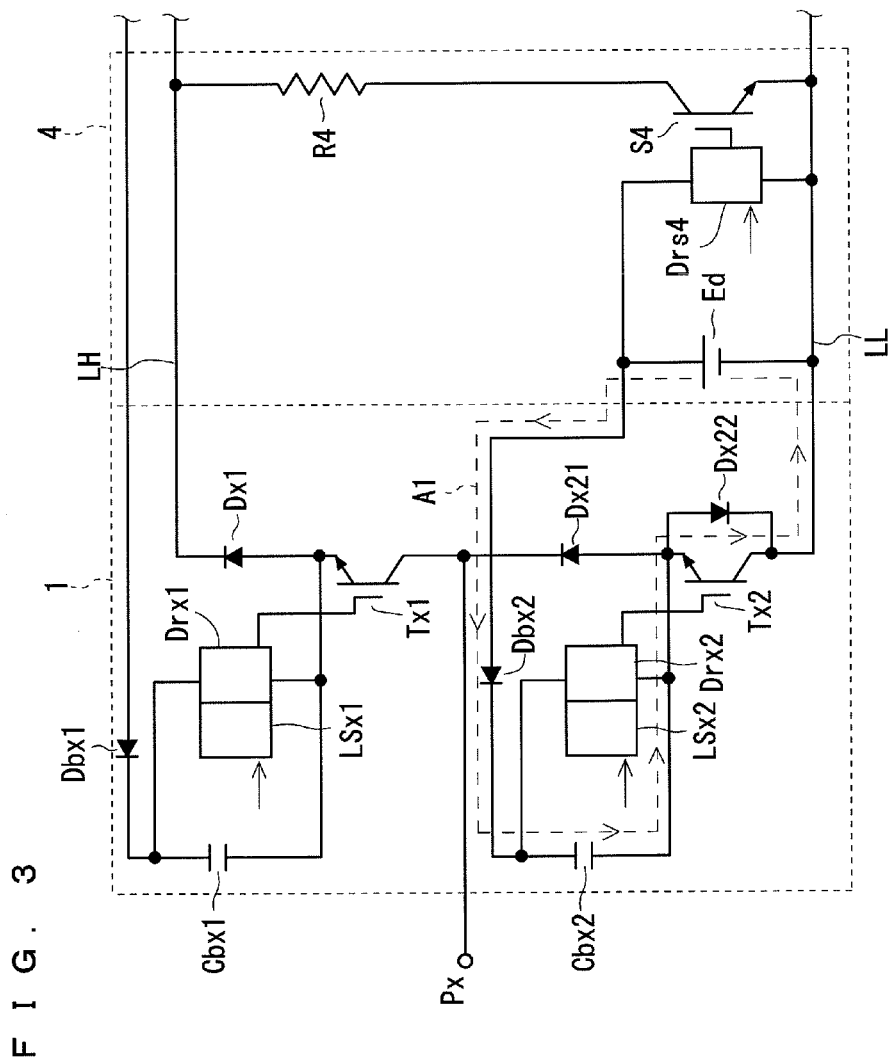

The voltage between both ends of the boot capacitor Cbx2 does not necessarily need to be obtained from the DC power supply Ed functioning as the operation power supply of the switching element Ty2 of the inverter 2. In other words, it merely needs to be obtained from the operation power supply of the switching element connected to the DC power supply line LL. For instance, the power converter of FIG. 3 may be adopted. In FIG. 3, only one switching leg is shown in the converter 1, and the inverter 2 and the load 3 are omitted. The power converter of FIG. 3 includes a brake circuit 4 between the converter 1 and the inverter 3, compared to the power converter of FIG. 1. The description made above is the same for the operation power supply of the switching element Tx1, and thus the detailed description will be omitted.

The brake circuit 4 includes a resistor R4 and a switching element S4. The resistor R4 and the switching element S4 are connected in series to each other between the DC power supply lines LH, LL. The switching element S4 is a switching element same as the switching elements Ty1, Ty2. In FIG. 3, the switching element S4 is shown as an insulated gate bipolar transistor. The switching element S4 is arranged with the emitter electrode directed towards the DC power line LL.

In such brake circuit 4, the switching element S4 is rendered conducting when the supply of electric current to the load 3, which is an inductive load, for example, is stopped. The regenerative electric current from the load 3 thus flows through the resistor R4. The regenerative energy from the load 3 can be consumed at an early stage.

The drive circuit Drs4 is connected to the emitter electrode of the switching element S4. The drive circuit Drs4 drives the switching element S4. The operation power supply is supplied from the DC power supply Ed to the drive circuit Drs4. One end on the low potential side of the DC power supply Ed is connected to the emitter electrode of the switching element Ty2 and the drive circuit Drs4. One end on the high potential side of the DC power supply Ed is connected to the drive circuit Drs4.

The anode of the diode Dbx2 is connected to one end on the high potential side of the DC power supply Ed.

In such power converter as well, the boot capacitor Cbx2 is charged with the DC power supply Ed as the power source. Therefore, the voltage that is large compared to the charging using the path in which the switching elements Tx1, Ty1, Ty2 are interposed can be charged to the boot capacitor Cbx2. In the normal operation as well, the boot capacitor Cbx2 can be charged through the switching element Tx2 or the diode Dx22, similar to the description referencing FIG. 2. Therefore, the electrostatic capacitance required by the boot capacitor Cbx2 can be reduced.

Such variant can be applied to other embodiments described below.

Second Embodiment

In a second embodiment, the operations and effects of the diodes Dbx2, Dx22 will be described in detail. First, a case in which the diode Dbx2 is not arranged will be considered. In the normal operation of the power converter, the converter 1 and the inverter 2 are switched. For instance, a surge voltage may be generated by such switching, and the potential of the emitter electrode of the switching element Tx2 may be increased by more than assumed. In other words, the voltage between the DC power line LL and the one end on the high potential side of the capacitor Cbx2 may be increased by more than assumed. Such voltage is applied to the DC power supply Ed and the drive circuit Dry2. The application of such voltage may cause instability in the operation of the switching element Ty2.

The diode Dbx2 can support the potential difference (difference between the potential on the high potential side of the DC power supply Ed and the potential on the high potential side of the capacitor Cbx2). Therefore, such problem can be prevented.

The operations and effects of the diode Dx21 will now be described. The diode Dx21 can support the voltage between the input end Px and the DC power supply line LL of when the potential applied to the input end Px is fluctuated. An inexpensive element having low withstanding voltage thus can be adopted for the switching element Tx2, the diode Dx22, and the diode Dbx2. The voltage between the collector and the emitter tends to be small in the case of a switching element having a low withstanding voltage, and the forward voltage tends to be small in the case of a diode having a low withstanding voltage. An element with satisfactory properties thus can be adopted.

Third Embodiment

In the first embodiment, the voltage of the operation power supply of each switching element may vary. For instance, consider the voltage drop that occurs in each configuring element of each path A1 to A3 with reference to FIG. 2. Assume here that the forward voltage of each diode is equal to each other and is voltage Vf, and the voltage between the emitter and the collector of each switching element is equal to each other and is voltage Vice, to simplify the explanation.

The boot capacitor Cby1 is charged through the diode Dby1 and the switching element Ty2 with the DC power supply Ed as the power supply. The boot capacitor Cby1 is charged on the path in the normal operation as well. The voltage Vcy1 between both ends of the boot capacitor Cby1 thus can be expressed with the following equation.

$$Vcby1 = Ed - Vf - Vce \quad (1)$$

The boot capacitor Cbx1 is charged through the diodes Dbx1, Dx11 and the switching element Ty1 with the boot capacitor Cby1 as the power supply. The boot capacitor Cbx1 is charged on the path in the normal operation as well.

The diode Dx1 is not interposed on the path A3 in the configuration in which the diode Dx1 is positioned on the input end Px side with respect to the switching element Tx1. Therefore, with such configuration, the voltage drop of the forward voltage Vf of the diode Dx1 may be ignored. A case in which the diode Dx1 is interposed on the path A3 will be described below.

The voltage Vcbx1 between both ends of the boot capacitor Cbx1 is expressed with the following equation.

$$Vcbx1 = Vcby1 - 2Vf - Vce = Ed - 3Vf - 2Vce \quad (2)$$

The charging path of the capacitor Cbx2 in the charging operation prior to the normal operation is the path A1, described above. In the path A1, the capacitor Cbx2 is charged through the diodes Dbx2, Dx22 with the DC power supply Ed as the power supply. Therefore, the voltage Vbcx2_d between both ends of the capacitor Cbx2 in such a case is expressed with the following equation.

$$Vbcx2\_d = Ed - 2Vf \quad (3)$$

There are two charging paths of the capacitor Cbx2 in the normal operation, as described in the first embodiment. However, the charging by the path A1 is performed only when the switching element Tx2 is non-conducted and the first terminal potential of the switching element Tx2 becomes the potential for rendering the diode Dx22 conducting, and thus the charging through the switching element Tx2 is mainly performed. In the path through the switching element Tx2, the capacitor Cbx2 is charged through the switching element Tx2 and the diode Dx22. Therefore, the voltage Vcbx2_t between both ends of the capacitor Cbx2 is expressed with the following equation.

$$Vcbx2\_t = Ed - Vf + Vce \quad (4)$$

If the variation in the voltage of the operation power supply can be reduced, the same switching element can be adopted, for example, and the variation in switching properties and the like of each switching element can be reduced. The variation in the voltage of the operation power supply of each switching element is reduced in the third embodiment.

Assume here that the voltage Vf is greater than the voltage Vce to simplify the explanation. Under such assumption, the voltage Vcbx1 between both ends of the boot capacitor Cbx1 is the smallest of those of the capacitors Cby1, Cbx2 and the DC power supply Ed.

Figure 4:
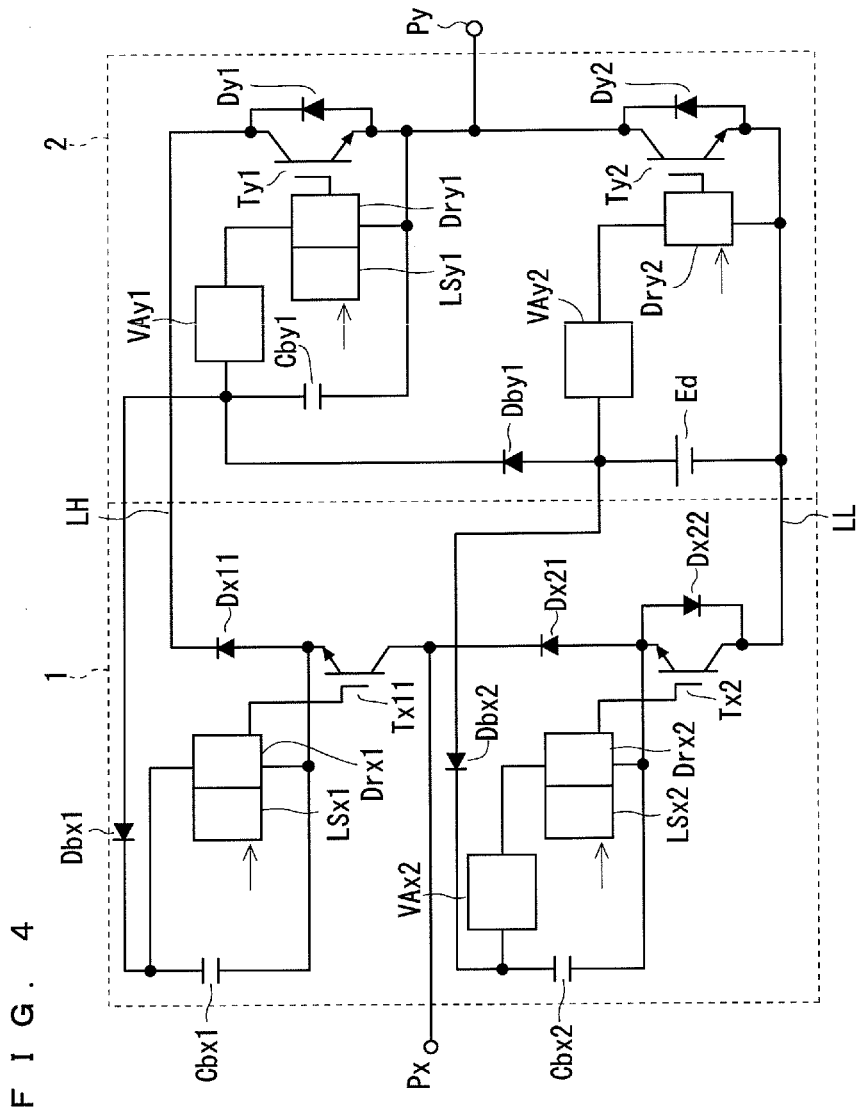

Under such assumption, the present power converter further includes voltage adjustment circuits VAy1, VAy2, VAx2, as shown in FIG. 4. In the illustration of FIG. 4, only one switching leg of the converter 1 and one switching leg of the inverter 3 are representatively illustrated.

The voltage adjustment circuit VAy2 is connected between one end on the high potential side, for example, of the DC power supply Ed and the drive circuit Dry2. The voltage adjustment circuit VAy2 is, for example, a resistor, and drops the voltage of the DC power supply Ed and supplies the same to the drive circuit Dry2 as the operation voltage. As a more specific example, the voltage of the DC power supply Ed is dropped by the sum of three times the voltage Vf and two times the voltage Vce, and supplied as the operation voltage. The operation voltages supplied to the drive circuits Drx1, Dry2 thus can be made equal to each other (see equation (2)).

The voltage adjustment circuit VAy1 is connected between one end on the high potential side, for example, of the boot capacitor Cby1 and the drive circuit Dry1. The voltage adjustment circuit VAy1 is, for example, a resistor, and drops the voltage between both ends of the boot capacitor Cby1 and supplies the same to the drive circuit Dry1 as the operation power supply. More specifically, the voltage between both ends of the boot capacitor Cby1 is dropped by the sum of two times the voltage Vf and the voltage Vce, and supplied as the operation voltage. The operation voltages supplied to the drive circuits Drx1, Dry1 thus can be made equal to each other (see equation (1) and equation (2)).

The voltage adjustment circuit VAx2 is connected between one end on the high potential side, for example, of the capacitor Cbx2 and the drive circuit Dry2. The voltage adjustment circuit VAx2 is, for example, a resistor, and drops the voltage between both ends of the boot capacitor Cbx2 and supplies the same to the drive circuit Drx2 as the operation supply. The voltage between both ends of the capacitor Cbx2 may adopt two voltages Vcbx2_d, Vcbx2_t according to the distinction of the charging path.

By way of example, the smaller voltage Vcbx2_d of the voltages Vcbx2_d, Vcbx2_t is adopted. The voltage adjustment circuit VAx2 drops the voltage Vcxb2 between both ends of the capacitor Cbx2 by the sum of two times the voltage Vce and the voltage Vf, and supplies the same as the operation power supply. The operation voltages supplied to the drive circuits Drx1, Drx2 can be made equal to each other when the voltage between both ends of the capacitor Cbx2 is the voltage Vcbx2_d. Furthermore, the difference in the operation voltages to be supplied to the drive circuits Drx1, Drx2 can be reduced even if the voltage of the capacitor Cbx2 is the voltage Vcbx2_t between both ends since the voltage adjustment unit VAx2 drops the same.

In the normal operation, the capacitor Cbx2 is mainly charged through the path including the switching element Tx2, and hence the voltage Vbcx2_t between both ends may be adopted.

A weighting coefficient may be multiplied to the voltages Vcbx2_t, Vcbx2_d between both ends and then added, which resultant value may be grasped as the voltage between both ends of the capacitor Cbx2. The weighting coefficient is, for example, a positive value, and the sum is one. The voltage adjustment circuit VAx2 may drop the voltage between both ends of the capacitor Cbx2 by the difference between such voltage (resultant value) between both ends and the voltage Vcbx1 between both ends.

A voltage clamp circuit may be connected in parallel to the capacitor Cbx2 and both voltages Vcbx2_t, Vcbx2_d between both ends may be set to take values higher than the clamp voltage, so that the voltage clamp circuit may supply a stable voltage to the drive circuit Drx2.

The voltage adjustment circuit is not limited to the mode described herein. For instance, a mode of dividing the voltage of the capacitor, or a mode of obtaining a constant voltage with the zener diode may be adopted. Furthermore, a mode of connecting an input of a regulator to both ends of the capacitor and connecting an output of the regulator to the drive circuit may be adopted.

Fourth Embodiment

In the first to third embodiments, the switching elements Tx1, Tx2 select to conduct/non-conduct the electric current in the direction (forward direction) from the DC power supply line LL towards the DC power supply line LH. The switching elements Tx1, Tx2 cannot select to conduct/non-conduct the electric current in the direction (reverse direction) from the DC power supply line LH towards the DC power supply line LL. If the switching elements Tx1, Tx2 are insulated gate bipolar transistors, for example, the electric current in the reverse direction does not flow. Furthermore, if the switching elements Tx1, Tx2 are MOS field effect transistors, the electric current in the reverse direction flows by the parasitic diode. In any case, the electric current in the reverse direction is inhibited by the diodes Dx1, Dx21 in the converter 1. In the fourth embodiment, the bi-directional switching is realized in the converter 1. This will be specifically described below.

The power converter shown in FIG. 5 differs from the power converter shown in FIG. 1 in the configuration of the converter 1.

The switching leg of the r phase includes the switching elements Tr11, Tr12, Tr21, Tr22, and the diodes Dr11, Dr12, Dr21, Dr22. The switching leg of the s phase includes the switching elements Ts11, Ts12, Ts21, Ts22, and the diodes Ds11, Ds12, Ds21, Ds22. The switching leg of the t phase includes the switching elements Tt11, Tt12, Tt21, Tt22, and the diodes Dt11, Dt12, Dt21, Dt22.

The switching elements Tx11, Tx12 (x represents r, s, t) are switching elements same as the switching element Tx1, and are, for example, insulated gate bipolar transistors, bipolar transistors, field effect transistors, and the like. The insulated gate bipolar transistor will be described below, by way of example. The switching elements Tx11, Tx12 are connected in series between the DC power supply line LH and the input end Px, where the emitter electrodes are connected to each other. The anode of the diode Dx11 is connected to the emitter electrode of the switching element Tx11, and the cathode is connected to the collector electrode of the switching element Tx12. The anode of the diode Dx21 is connected to the emitter electrode of the switching element Tx21, and the cathode is connected to the collector electrode of the switching element Tx11.

The switching elements Tx21, Tx22 are switching elements same as the switching element Tx2, and are, for example, insulated gate bipolar transistors, bipolar transistors, field effect transistors, and the like. The insulated gate bipolar transistor will be described below, by way of example. The switching elements Tx21, Tx22 are connected in series between the DC power supply line LL and the input end Px, where the emitter electrodes are connected to each other. The anode of the diode Dx21 is connected to the emitter electrode of the switching element Tx21, and the cathode is connected to the collector electrode of the switching element Tx22. The anode of the diode Dx22 is connected to the emitter electrode of the switching element Tx22, and the cathode is connected to the collector electrode of the switching element Tx21.

According to such converter 1, the switching elements Tx11, Tx12 and the diodes Dx11, Dx12 configure the bi-directional switch. Similarly, the switching elements Tx21, Tx22 and the diodes Dx21, Dx22 configure the bi-directional switch. Therefore, if the load 3 is the inductive load, the regenerative electric current generated from the induction property can be flowed towards the power source through the converter 1.

Figure 6:
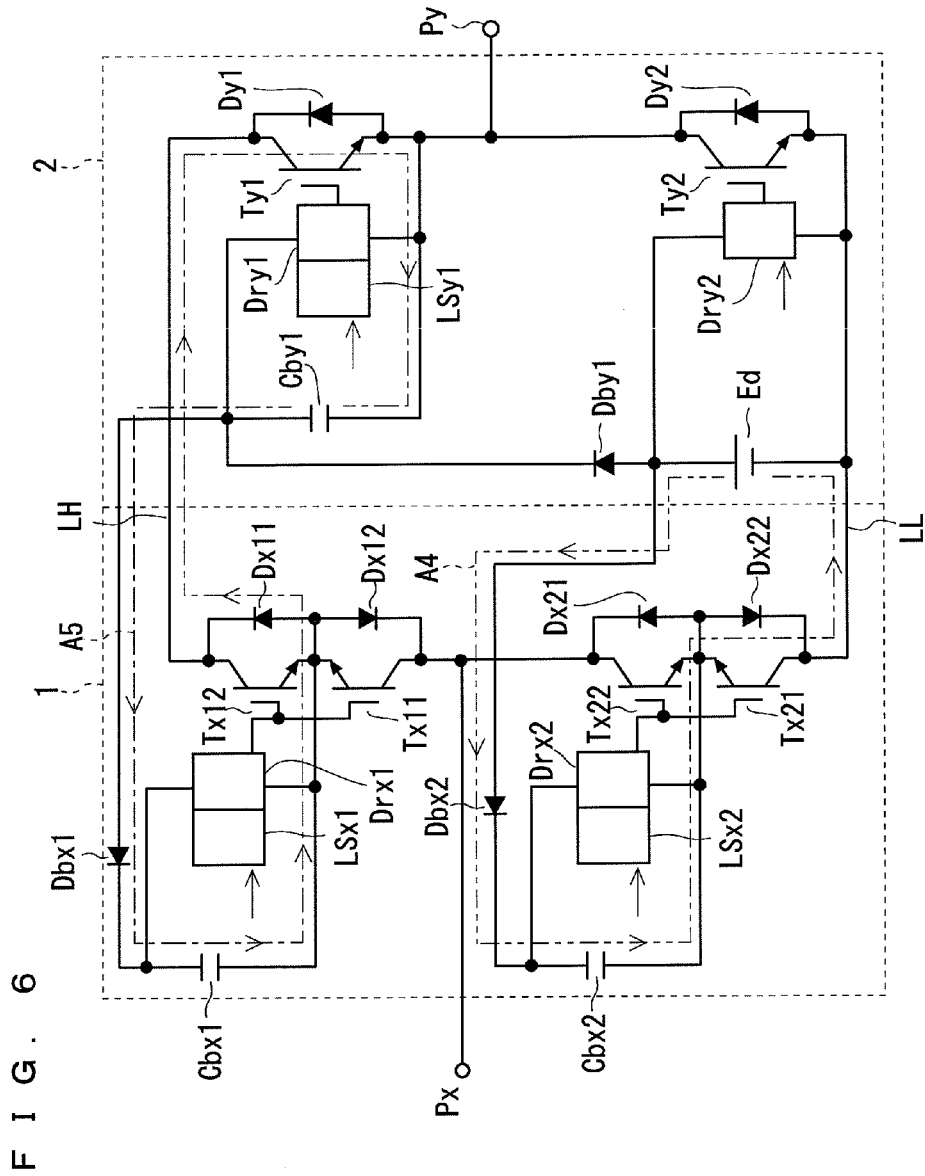

Furthermore, according to the converter 1, the emitter electrodes of the switching elements Tx11, Tx12 are connected to each other, and the emitter electrodes of the switching elements Tx21, Tx22 are connected to each other. Therefore, as shown in FIG. 6, the operation power supplies of the switching elements Tx11, Tx12 can be made common, and the operation power supplies of the switching elements Tx21, Tx22 can be made common. Thus, the manufacturing cost can be reduced compared to when the operation power supply is separately arranged. This will be more specifically described below.

First, the operation power supply of the switching elements Tx21, Tx22 will be described. The switching elements Tx21, Tx22 are driven by the drive circuit Drx2. The drive circuit Drx2 is commonly connected to the gate electrodes of the switching elements Tx21, Tx22. The level shift circuit LSx2 is connected to the drive circuit Drx2.

The voltage between both ends of the capacitor Cbx2 is supplied to the drive circuit Drx2 as the operation power supply. One end of the capacitor Cbx2 is connected to the emitter electrode of the switching element Tx21, Tx22 and the drive circuit Drx2. The other end of the capacitor Cbx2 is connected to the drive circuit Drx2.

The other end of the capacitor Cbx2 is connected to one end on the high potential side of the DC power supply Ed through the diode Dbx2. The diode Dbx2 is arranged with the cathode directed towards the capacitor Cbx2. The diode Dbx2 prevents the capacitor Cbx2 from discharging towards the DC power supply Ed.

Such capacitor Cbx2 is charged prior to the normal operation of the power converter. Specifically, the electric current flows through a path A4 from the DC power supply Ed to the capacitor Cbx2 through the diodes Dbx2, Dx22, thus charging the capacitor Cbx2.

Therefore, the operation power supply of the switching elements Tx21, Tx22 can be made common, and the capacitor Cbx2 can be adopted for such operation power supply, so that the number of DC power supplies can be reduced.

The capacitor Cbx2 is charged in the normal operation of the present power converter. The power running operation and the regenerating operation will be separately described. The power running operation is the operation in which the electric current is flowed from the power supply to the load 3 to drive the load 3. In the power running operation, the electric current is flowed from the DC power supply line LH to the DC power supply line LL through the inverter 2 and the load 3. The regenerating operation is the operation of regenerating the regenerative electric current generated from the induction property towards the power supply when the load 3 is an inductive load, or the operation of regenerating the regenerative electric current generated from the state of the load towards the power supply when the load 3 is a motor load or the like having a large inertia. In the regenerating operation, the electric current is flowed from the DC power supply line LH to the DC power supply line LL through the converter 1 and the power supply.

In the power running operation, the electric current flows from the DC power supply line LL to the input end Px through itself and the diode Dx21 by the conduction of the switching element Tx21. In this case, the electric current flows from the DC power supply Ed to the capacitor Cbx2 through the diode Dbx2 and the switching element Tx21, similar to the first embodiment. The capacitor Cbx2 is thereby charged.

In the regenerating operation, the electric current flows from the input end Px to the DC power supply line LL through itself and the diode Dx22 by the conduction of the switching element Tx22. The electric current flows through the path A4 as the diode Dx22 is rendered conducting, thus charging the capacitor Cbx2.

The electrostatic capacitance required by the capacitor Cbx2 can be reduced since the capacitor Cbx2 is charged even in the normal operation, as described above.

The operation power supply of the switching elements Tx11, Tx12 will now be described. The switching elements Tx11, Tx12 are driven by the drive circuit Drx1. The drive circuit Drx1 is commonly connected to the gate electrodes of the switching elements Tx11, Tx12. The level shift circuit LSx1 is connected to the drive circuit Drx1.

A voltage between both ends of a boot capacitor Cbx1 is supplied to the drive circuit Drx1 as the operation power supply. One end of the boot capacitor Cbx1 is connected to the emitter electrodes of the switching elements Tx11, Tx12, and the drive circuit Drx1. The other end of the boot capacitor Cbx1 is connected to the drive circuit Drx1.

The other end of the boot capacitor Cbx1 is connected to one end on the high potential side of the boot capacitor Cby1 by way of the diode Dbx1. The diode Dbx1 is arranged with the cathode directed towards the boot capacitor Cbx1. The diode Dbx1 prevents the boot capacitor Cbx1 from discharging towards the boot capacitor Cby1.

According to such configuration, the boot capacitor Cbx1 can be charged using the charges accumulated in the boot capacitor Cby1 by conducting the switching element Ty1. This is because the electric current flows through a path A5 including the boot capacitor Cby1, the diode Dbx1, the boot capacitor Cbx1, the diode Dx11, and the switching element Ty1 according to such conduction.

Therefore, the operation power supplies of the switching elements Tx11, Tx12 can be made common, and the boot capacitor Cbx1 is adopted for such operation power supply, so that the number of DC power supplies can be reduced.

The third embodiment may be applied to the present power converter. In this case, a question, which one of voltages Vcbx2_t and Vcbx2_d between both ends (see equations 3, 4) is adopted as the voltage between both ends of the capacitor Cbx2, arises. In conclusion, either may be adopted. This is because the variation in the operation voltage of the switching element can be reduced in any case. The weighting coefficient may be multiplied on each of voltages Vcbx2_t, Vcbx2_d between both ends and then added, and such resultant value may be adopted. In this case, a high value may be adopted for the weighting coefficient for the voltage Vcbx2_t between both ends if the period during regeneration is relatively large, in view of the operation situation of the load 3.

A voltage clamp circuit may be connected in parallel to the capacitor Cbx2 and both voltages Vcbx2_t, Vcbx2_d between both ends may be set to take values higher than the clamp voltage, so that the voltage clamp circuit may supply a stable voltage to the drive circuit Drx2.

The capacitor (Cbx2) merely needs to be able to accumulate charges as the operation power supply of the switching element, and thus is not limited to the form of a capacitor. The parallel circuit of the switching element and the diode may be configured with a MOSFET including a parasitic diode or a reverse conduction element such as a reverse conduction IGBT.

A resistor, or the like may be inserted in the charging path of the capacitors Cbx1, Cbx2, Cby1 to limit the electric current during the charging.

The present invention has been described in detail above, but the description is merely illustrative in all aspects and should not be construed as limiting the present invention. It should be recognized that an infinite number of variants that are not described herein can be contrived without deviating from the scope of the invention.

DESCRIPTION OF SYMBOLS

Cbx1, Cby1 boot capacitor
Cbx2 capacitor
Dx21, Dbx2 diode
Ed DC power supply
LH, LL DC power supply line
Pr, Ps, Pt input end
Pu, Pv, Pw output end
VAx1, VAx2, VAy1 voltage adjustment unit

The invention claimed is:
1. A power converter comprising:
a first power supply line;
a second power supply line applied with a potential lower than that of said first power supply line;
a switch circuit including a switching element arranged between said first and second power supply lines, and a power supply unit having both ends between which a DC voltage is supported, one end on a low potential side of said ends being connected to said switching element on said second power supply line side, and serving as an operation power supply for outputting a switch signal to said switching element; and a power conversion unit including a one-directional conduction switching element including a first electrode and a second electrode, renders only electric current flowing from said second electrode to said first electrode conducting, and being arranged between said first and second power supply lines with said first electrode directed towards said first power supply line side; a diode connected in parallel with said one-directional conduction switching element with an anode directed towards said first power supply line side; and a capacitor including one end connected to said first electrode and another end electrically connected to another end of said power supply unit and serving as an operation power supply for outputting a switch signal to said one-directional conduction switching element when charged.

2. The power converter according to claim 1, further comprising a second diode arranged between said capacitor and another end of said power supply unit with having an anode directed towards said power supply unit.

3. The power converter according to claim 2, wherein said switch circuit further includes a voltage adjustment unit for dropping a voltage of said power supply unit and supplying an operation voltage of said switching element.

4. The power converter according to claim 2, further comprising a third diode having a cathode directed towards said first power supply line, and an anode connected with said first electrode of said one-directional conduction switching element.

5. The power converter according to claim 4, wherein said switch circuit further includes a voltage adjustment unit for dropping a voltage of said power supply unit and supplying an operation voltage of said switching element.

6. The power converter according to claim 4, wherein said power conversion unit further includes a second switching element connected in series with said one-directional conduction switching element and connected in parallel with said third diode, and said capacitor functions as an operation power supply for outputting switch signal to said second switching element.

7. The power converter according to claim 6, wherein said switch circuit further includes a voltage adjustment unit for dropping a voltage of said power supply unit and supplying an operation voltage of said switching element.

8. The power converter according to claim 1, further comprising a third diode having a cathode directed towards said first power supply line, and an anode connected with said first electrode of said one-directional conduction switching element.

9. The power converter according to claim 8, wherein said switch circuit further includes a voltage adjustment unit for dropping a voltage of said power supply unit and supplying an operation voltage of said switching element.

10. The power converter according to claim 8, wherein said power conversion unit further includes a second switching element connected in series with said one-directional conduction switching element and connected in parallel with said third diode, and said capacitor functions as an operation power supply for outputting switch signal to said second switching element.

11. The power converter according to claim 10, wherein said switch circuit further includes a voltage adjustment unit for dropping a voltage of said power supply unit and supplying an operation voltage of said switching element.

12. The power converter according to claim 1, wherein said switch circuit further includes a voltage adjustment unit for dropping a voltage of said power supply unit and supplying an operation voltage of said switching element.

* * * * *